(12) United States Patent
Miyazaki et al.

(10) Patent No.: US 9,331,125 B2
(45) Date of Patent: May 3, 2016

(54) SOLID-STATE IMAGING DEVICE USING PLASMON RESONATOR FILTER

(71) Applicant: Kabushiki Kaisha Toshiba, Minato-ku (JP)

(72) Inventors: Takashi Miyazaki, Kawasaki (JP); Ikuo Fujiwara, Yokohama (JP); Hideyuki Funaki, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/555,889

(22) Filed: Nov. 28, 2014

(65) Prior Publication Data

US 2015/0270314 A1   Sep. 24, 2015

(30) Foreign Application Priority Data

Mar. 19, 2014   (JP) ................. 2014-056222

(51) Int. Cl.
*H01L 27/30* (2006.01)
*H01L 31/0376* (2006.01)
*H01L 27/146* (2006.01)

(52) U.S. Cl.
CPC ........ *H01L 27/307* (2013.01); *H01L 27/14621* (2013.01); *H01L 27/14629* (2013.01); *H01L 27/14632* (2013.01); *H01L 27/14647* (2013.01); *H01L 31/03762* (2013.01)

(58) Field of Classification Search
USPC .................................................... 257/40, 53
See application file for complete search history.

(56) References Cited

U.S. PATENT DOCUMENTS

| | | | |
|---|---|---|---|
| 8,816,358 B1 * | 8/2014 | Tsai | H01L 27/307 257/79 |
| 2005/0012840 A1 * | 1/2005 | Hsieh | H01L 27/14609 348/308 |
| 2005/0205958 A1 | 9/2005 | Taniguchi et al. | |
| 2006/0044561 A1 | 3/2006 | Nii | |
| 2007/0045760 A1 | 3/2007 | Ihama | |
| 2008/0246853 A1 | 10/2008 | Takizawa et al. | |
| 2011/0019042 A1 | 1/2011 | Yamaguchi | |
| 2014/0139714 A1 | 5/2014 | Fujiwara et al. | |

FOREIGN PATENT DOCUMENTS

| | | |
|---|---|---|
| JP | 2005-268609 A | 9/2005 |
| JP | 2006-100767 A | 4/2006 |
| JP | 2007-59516 A | 3/2007 |
| JP | 2008-258474 | 10/2008 |
| JP | 2011-29337 | 2/2011 |
| JP | 2014-103162 | 6/2014 |

* cited by examiner

*Primary Examiner* — Jerome Jackson, Jr.
*Assistant Examiner* — Charles R Peters
(74) *Attorney, Agent, or Firm* — Oblon, McClelland, Maier & Neustadt, L.L.P.

(57) ABSTRACT

According to one embodiment, a solid-state imaging device includes: a first inorganic photoelectric converter; a semiconductor substrate that includes a light-receiving face to which light is to be incident and a circuit-formed surface on which a circuit including a readout circuit is formed, the light-receiving face facing the first inorganic photoelectric converter, the semiconductor substrate including a second inorganic photoelectric converter thereinside; and a first part including a microstructure arranged between the first inorganic photoelectric converter and the second inorganic photoelectric converter.

7 Claims, 5 Drawing Sheets

SOLID-STATE IMAGING DEVICE USING PLASMON RESONATOR FILTER

CROSS-REFERENCE TO RELATED APPLICATION

This application is based upon and claims the benefit of priority from Japanese Patent Application No. 2014-056222, filed Mar. 19, 2014; the entire contents of which are incorporated herein by reference.

FIELD

Embodiments described herein relate generally to a solid-state imaging device.

BACKGROUND

Conventionally, solid-state image sensing devices such as CMOS (Complementary Metal Oxide Semiconductor) image sensor or CCD (Charge Coupled Device) are widely used in digital still cameras, digital video camera, or the like.

Furthermore, in recent years, a solid-state image sensing device is packaged in mobile devices such as mobile phone devices having an imaging function.

Of solid-state image sensing devices, a CMOS image sensor is often adopted in a mobile device in terms of a low power supply voltage and a low power consumption.

In such CMOS image sensor, as light enters a light-receiving face of each of pixels which are arrayed in a matrix form, the light is photoelectrically converted into electrical power by a photodiode (PD: Photodiode) that serves as a photoelectric converter provided on each pixel.

The electrical charge that is generated in the PD is transferred through a transfer transistor to a floating diffusion (FD: Floating Diffusion) that is a floating diffusion region.

Thereafter, a pixel signal having a level according to the electrical charge accumulated in the FD is output by an amplification transistor.

Additionally, in the case of a full color solid-state image sensing device, the device has a pixel array in which pixels emitting colored lights of respective red (R), green (G), and blue (B) are arrayed on a plane.

In a lot of cases, a bayer array is adopted as the above-described pixel array.

Absorbing color filters which correspond to the colored lights of the respective red, green, and blue are arranged on the pixel array, and each colored light is selectively transmitted therethrough.

A solid-state imaging device is proposed in which green, blue, and red of photoelectric conversion layers are stacked in layers in the same pixel and in the depth direction thereof.

This solid-state imaging device includes a constitution in which a blue PD (photoelectric converter) and a red PD (photoelectric converter) are formed in a silicon substrate and in the depth direction thereof, and a green organic photoelectric converter that includes electrodes sandwiching an organic photoelectric conversion layer is formed on an upper layer surface of the silicon substrate which is close to a light-receiving face.

According to this structure, the effects, that since an optical loss in the above-mentioned color filter does not occur, the sensitivity thereof is improved, and since a process of interpolating pixels is not carried out, a false color does not occur, can be expected.

On the other hand, as a backside illumination CMOS image sensor, a solid-state imaging device that includes a color filter, a PD that is stacked in a depth direction, and an organic photoelectric conversion layer is proposed.

In the solid-state imaging device, yellow and cyanogen color filters are arranged with a checkerboard pattern, red and blue PDs are arranged to correspond to the respective color filters.

Furthermore, an organic photoelectric converter is disposed on the upper layer of each PD.

The solid-state imaging device is configured to extract a green signal from the organic photoelectric converter, to extract a red signal from the PD located under the yellow filter, and to extract a blue signal from the PD located under the cyan filter.

However, the blue PD and the red PD are stacked in layers in the silicon substrate in the depth direction thereof in the aforementioned solid-state imaging device, and the solid-state imaging device utilizes the principle of diffracting blue light and red light such that an absorption factor of a silicon substrate has chromatic dispersion characteristics.

Particularly, a silicon substrate has the characteristics such that, the shorter the wavelength of light, it is easy for the light to be easily absorbed.

In this case, blue light is completely absorbed by photo-electric conversion at a shallow region which is close to a surface of the silicon substrate which is close to the light-receiving face.

On the other hand, red light only propagates to a deeper region which is far from the light-receiving face side.

Consequently, in the above-described stacked solid-state imaging device, diffraction of blue light and red light is carried out by arranging the blue PD at the shallow region which is close to the surface of the silicon substrate and is close to the light-receiving face and by arranging the red PD at the deeper region which is far from the light-receiving face.

Furthermore, in the case of the stacked solid-state imaging device, in order to sufficiently lower an amount of blue light (hereinbelow, referred to as blue color mixture) that is photoelectrically converted into power at the red PD, it is necessary for a distance between the blue PD and the red PD in the depth direction to be significantly large.

DETAILED DESCRIPTION

Hereinafter, the solid-state imaging device according to the embodiment will be described with reference to drawings.

In these drawings which are utilized in the following explanation, appropriate changes have been made in the scale of the various constituent members, in order to represent them at scales at which they can be easily understood.

Moreover, materials, dimensions, or the like which are explained below are described as an example and are not limited to embodiments, and various modifications may be made.

According to one embodiment, a solid-state imaging device includes: a first inorganic photoelectric converter; a semiconductor substrate; and a first part including a microstructure.

The semiconductor substrate includes a light-receiving face to which light is to be incident and which faces the first inorganic photoelectric converter and a circuit-formed surface on which a circuit including a readout circuit is formed. The semiconductor substrate includes a second inorganic photoelectric converter thereinside.

The microstructure is arranged between the first inorganic photoelectric converter and the second inorganic photoelectric converter.

Figure 1:
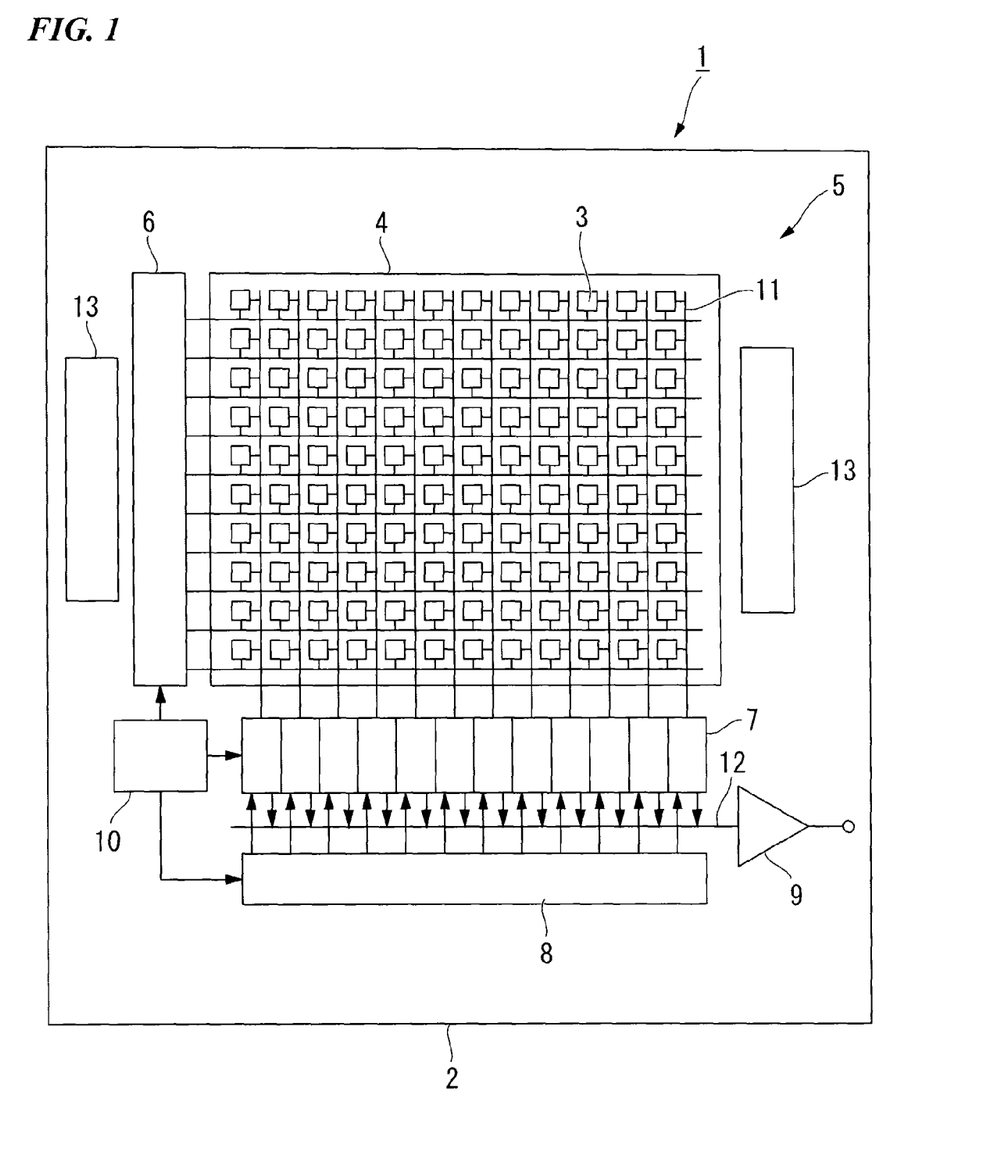
FIG. 1 is a schematic view showing a constitution of the solid-state imaging device according to embodiments.

FIG. 1 schematically shows a schematic constitution of a solid-state imaging device 1 according to the embodiment.

As shown in FIG. 1, the solid-state imaging device 1 serves as a CMOS image sensor and includes a pixel unit 4 (imaging region) on which a plurality of pixels 3 are arrayed in a matrix on a plane surface of a semiconductor substrate 2 formed of, for example, a silicon substrate or the like.

Each pixel 3 is configured to include a plurality of photoelectric converters and a plurality of pixel transistors (referred to as a MOS transistor).

The pixel transistors include three transistors (not shown in the figure) which are, for example, a transfer transistor, a reset transistor, and an amplification transistor.

Furthermore, the pixel transistors may include four transistors which are the above three transistors and a select transistor.

Each pixel 3 may adopt a so-called multi-pixel sharing structure which shares the photoelectric converters and another pixel transistor except for the transfer transistor and shares a floating diffusion (FD).

Since the equivalent circuit of each pixel 3 is the same as a conventional circuit, an explanation therefore is omitted here.

The solid-state imaging device 1 is provided with a peripheral circuit 5 around the pixel unit 4.

The peripheral circuit 5 is configured to include a vertical drive circuit 6, column signal processing circuits 7, a horizontal drive circuit 8, an output circuit 9, a control circuit 10, vertical signal lines 11, horizontal signal lines 12, input-output terminals 13, or the like.

The vertical drive circuit 6 is formed by, for example, a shift register, is configured to select pixel driving wirings, supply pulses to the selected pixel driving wirings for driving pixels, and thereby drive pixels for each row.

That is, the vertical drive circuit 6 sequentially selects and scans each pixel 3 for each row in the vertical direction, and supplies pixel signals to the column signal processing circuits 7 through the vertical signal lines 11.

The pixel signal is based on a signal charge that is generated in accordance with the amount of light received by, for example, a photodiode (PD) serving as a photoelectric converter of each pixel 3.

Each of the column signal processing circuits 7 is arranged at, for example, a corresponding row of the pixels 3, and carries out a signal processing for each row of the pixels such as removing noise of signals output from one row of the pixels 3.

Particularly, the column signal processing circuit 7 carries out a signal processing such as CDS (Correlated double sampling) for removing fixed pattern noise peculiar to the pixel 3, signal amplification, or AD conversion.

A horizontal selecting switch (not shown in the figure) is provided at a output unit of the column signal processing circuit 7 so as to be connected to the horizontal signal line 12.

The horizontal drive circuit 8 includes, for example, a shift register.

The horizontal drive circuit 8 sequentially selects each of the column signal processing circuits 7 by sequentially outputting horizontal scanning pulses, and thereby causes a pixel signal to be output from each of the column signal processing circuits 7 to the horizontal signal line 12.

The output circuit 9 processes the signal that is sequentially supplied from each of the column signal processing circuits 7 through the horizontal signal line 12, and outputs the processed signal.

As such signal processing, a process of only performing buffering, a process of adjusting black level, a process of correcting a variation between rows, various digital signal processings, or the like are adopted.

The control circuit 10 receives an input clock and data that commands an operating mode or the like.

Furthermore, the control circuit 10 outputs data such as inside information of the solid-state imaging device 1.

That is, in the control circuit 10, a clock signal or a control signal which is used to control an operation of the vertical drive circuit 6, the column signal processing circuit 7, the horizontal drive circuit 8, or the like is generated based on a vertical synchronizing signal, a horizontal synchronizing signal, and a master clock signal.

Subsequently, the above-described signals are input to the vertical drive circuit 6, the column signal processing circuit 7, the horizontal drive circuit 8, or the like.

Signal communication between the solid-state imaging device 1 and external devices is carried out through the input-output terminals 13.

First Embodiment

Next, a solid-state imaging device 1A according to a first embodiment will be described with reference to FIG. 2.

Figure 2:
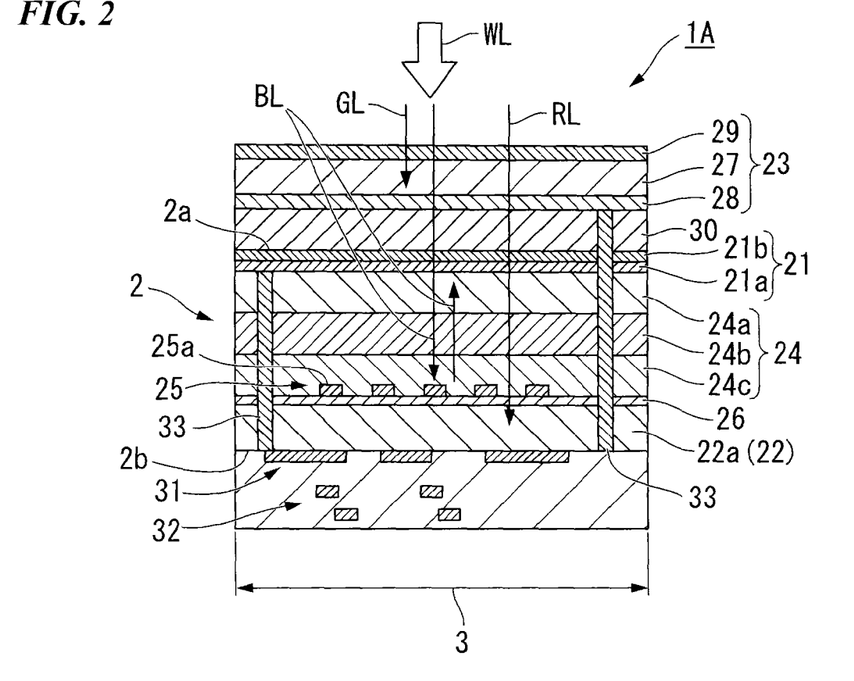
FIG. 2 is a cross-sectional view showing a cross-section structure of the solid-state imaging device according to a first embodiment.

FIG. 2 is a cross-sectional view showing a cross-section structure corresponding to one pixel 3 that is provided in the solid-state imaging device 1A according to the first embodiment.

In the solid-state imaging device 1A according to the first embodiment, identical reference numerals are used for the elements which are identical to those of the solid-state imaging device 1 shown in the aforementioned FIG. 1, and an explanation thereof is omitted here.

Each pixel 3 includes a first part in the solid-state imaging device 1A according to the first embodiment.

The first part includes a first inorganic photoelectric converter, a semiconductor substrate, and a microstructure.

The semiconductor substrate includes: a light-receiving face to which light is to be incident; and a circuit-formed surface on which a circuit comprising a readout circuit is formed. The light-receiving face faces the first inorganic photoelectric converter. The semiconductor substrate includes a second inorganic photoelectric converter thereinside.

The microstructure is provided between the first inorganic photoelectric converter and the second inorganic photoelectric converter.

Specifically, as shown in FIG. 2, the solid-state imaging device 1A is a so-called backside illumination type imaging device, the back surface of the semiconductor substrate 2 (upper surface of the semiconductor substrate 2 shown in FIG. 2) serves as a light-receiving face 2a to which light WL is incident, and the top surface of the semiconductor substrate 2 (bottom surface of the semiconductor substrate 2 shown in FIG. 2) serves as a circuit-formed surface 2b on which circuits including a readout circuit are formed.

The semiconductor substrate 2 is formed by use of a silicon substrate in which a p-n junction can be formed by doping ion impurities thereinto.

A substrate made of, for example, crystal silicon (cSi), amorphous silicon, or the like may be adopted as a silicon substrate.

The solid-state imaging device 1A serves as a so-called stacked CMOS image sensor and includes: a first inorganic photoelectric converter 21 and a second inorganic photoelectric converter 22 which are stacked in order from the light-receiving face 2a in the depth direction thereof in the semiconductor substrate 2; and an organic photoelectric converter 23 formed on the surface of the semiconductor substrate 2 which is closer to the light-receiving face 2a than the circuit-formed surface 2b.

This means that the solid-state imaging device 1A has a constitution in which the organic photoelectric converter 23, the first inorganic photoelectric converter 21, and the second inorganic photoelectric converter 22 are stacked in order from the light-receiving face 2a.

Therefore, in one pixel 3, the first inorganic photoelectric converter 21, the second inorganic photoelectric converter 22, and the organic photoelectric converter 23 are disposed at a position at which they are stacked in layers in a plan view.

In the solid-state imaging device 1A, of light WL that is incident to the light-receiving face 2a, the organic photoelectric converter 23 photoelectrically converts green light GL (light having a third wavelength component) into electrical power, the first inorganic photoelectric converter 21 photoelectrically converts blue light BL (light having a first wavelength component) into electrical power, and the second inorganic photoelectric converter 22 photoelectrically converts red light RL (light having a second wavelength component) into electrical power.

The first inorganic photoelectric converter 21 includes a blue color photodiode (PD) formed by P-type amorphous silicon having a depletion layer thereinside.

Particularly, a thinned P-type amorphous silicon layer that serves as a blue-light absorbing layer 21a absorbing the blue light BL is formed in the first inorganic photoelectric converter 21.

Additionally, in order to form a depletion layer region that separates electron-hole pair excited by the blue light BL inside the blue-light absorbing layer 21a, a hafnium oxide layer 21b having a negative fixed charge is formed on the light-receiving face 2a of the P-type amorphous silicon layer.

In the case of using a material having a high absorption factor such as amorphous silicon, the wavelength thereof becomes shorter, the light absorption factor thereof becomes higher.

The first inorganic photoelectric converter 21 utilizes the characteristics that the foregoing absorption factor depends on the wavelength thereof, and the amorphous silicon layer (the blue-light absorbing layer 21a) is thinned so as to obtain a thickness by which the blue light BL is selectively absorbed.

A silicon nitride layer 24a, a silicon oxynitride layer 24b, and a silicon oxide layer 24c which serve as an insulating layer 24 are formed under the blue-light absorbing layer 21a in order from the light-receiving face 2a.

In the insulating layer 24, as a result of forming the silicon nitride layer 24a, the silicon oxynitride layer 24b, and the silicon oxide layer 24c between the blue-light absorbing layer 21a and the silicon oxide layer 24c and in order from the light-receiving face 2a so that the refractive indexes thereof lower in a stepwise manner, it is possible to prevent interface reflection from being generated therebetween.

Particularly, in the embodiment, the blue-light absorbing layer 21a has a thickness of 10 nm, the silicon nitride layer 24a has a thickness of 50 nm, the silicon oxynitride layer 24b has a thickness of 50 nm, and the silicon oxide layer 24c has a thickness of 75 nm.

The second inorganic photoelectric converter 22 includes a red color photodiode (PD) having a p-n junction.

Particularly, in the second inorganic photoelectric converter 22, a p-n junction is formed by doping ion impurities into the inside of a silicon layer serving as a red-light absorbing layer 22a absorbing the red light RL.

Particularly, in the embodiment, an amorphous silicon layer having a thickness of 300 nm is used as the red-light absorbing layer 22a.

Here, where an absorption factor of the blue-light absorbing layer 21a is represented by $\alpha_B$ [nm$^{-1}$], a thickness of the blue-light absorbing layer 21a is represented by $d_B$ [nm], it is preferable that a relationship represented by the following Formula (1) be satisfied.

$$0.2 < \alpha_B \cdot d_B < 2.3 \qquad (1)$$

That is, in the case where a wavelength range of the blue light BL is in a range of, for example, 400 to 500 nm (470 nm in the embodiment), where the percentage of the blue light BL passing through the blue-light absorbing layer 21a is less than 10% of the light WL entering the light-receiving face 2a, $\alpha_B \cdot d_B < 2.3$ is satisfied.

On the other hand, where the percentage of the red light RL that is absorbed by the blue-light absorbing layer 21a is less than 10% of the light WL entering the light-receiving face 2a, $0.21 < \alpha_B \cdot d_B$ is satisfied.

As described above, a relationship represented by Formula (1) is satisfied for one wavelength of the blue light BL absorbed by the blue-light absorbing layer 21a.

Preferably, the relationship represented by Formula (1) is satisfied in the peak wavelength of the blue light BL.

More preferably, the relationship represented by Formula (1) is satisfied in a wavelength region including the peak wavelength of the blue light BL.

Furthermore, where an absorption factor of the red-light absorbing layer 22a is represented by $\alpha_R$ [nm$^{-1}$], a thickness of the red-light absorbing layer is represented by $d_R$ [nm], it is preferable that a relationship represented by the following Formula (2) be satisfied.

$$1.4 < \alpha_R \cdot d_R < 2.6 \qquad (2)$$

In the case where a wavelength range of the red light RL is in a range of, for example, 600 to 700 nm (in the embodiment 630 nm), the percentage of the absorbed red light RL is greater than 75% of the light WL entering the light-receiving face 2a, where the percentage of the red light RL that is absorbed by the first inorganic photoelectric converter 21 and the organic photoelectric converter 23 is less than 10% of the light WL entering the light-receiving face 2a, $\alpha_R \cdot d_R < 2.6$ is satisfied.

On the other hand, where the percentage of the red light RL that is absorbed by the first inorganic photoelectric converter 21 and the organic photoelectric converter 23 is 0% of the light WL entering the light-receiving face 2a, $1.4 < \alpha_R \cdot d_R$ is satisfied.

As described above, a relationship represented by Formula (2) is satisfied for one wavelength of the red light RL absorbed by the red-light absorbing layer 22a.

Preferably, the relationship represented by Formula (2) is satisfied in the peak wavelength of the red light RL.

More preferably, the relationship represented by Formula (2) is satisfied in a wavelength region including the peak wavelength of the red light RL.

A microstructure 25 is arranged between the first inorganic photoelectric converter 21 and the second inorganic photoelectric converter 22.

The microstructure 25 is configured to reflect the blue light BL that is to be absorbed by the first inorganic photoelectric converter 21 and allow the red light RL that is to be absorbed by the second inorganic photoelectric converter 22 to pass therethrough, and has a function of spectrally separating the blue light BL and the red light RL.

Particularly, the microstructure 25 includes a so-called nano array structure in which a plurality of micro dots 25a are arranged in an array arrangement.

Each dot 25a is formed on the surface of the semiconductor substrate 2 (the second inorganic photoelectric converter 22) which faces the light-receiving face 2a (light-receiving face side of the second inorganic photoelectric converter) with a silicon nitride layer 26 interposed therebetween.

Moreover, the microstructure 25 can be formed by using a metal (e.g., aluminum, gold, silver, or copper), silicon, a dielectric material, or the like.

In the microstructure 25, as a result of providing the above-described nano array structure thereto, it is possible to obtain a wavelength selectivity that reflects the blue light BL and allows the red light RL to pass therethrough.

Particularly, as a result of stacking materials that have effective refractive indexes different from each other, the microstructure 25 can obtain a wavelength selectivity.

Moreover, in the microstructure 25, it is possible to obtain the wavelength selectivity by utilizing surface plasmon resonance.

In addition, it is preferable that each dot 25a have a symmetric shape on a plane surface in a plan view such as a circle or an equilateral polygon (square or the like). More preferably, each dot 25a is formed in a circle.

In the case where the dot 25a has a planar configuration with a low degree of symmetry, a wavelength range of light passing through the microstructure 25 may vary depending on an incident direction and a polarization direction of light.

For example, in the case where the microstructure 25 has an asymmetric shape on a plane surface of a substrate in a longitudinal direction and a lateral direction, when light having a wavelength region passes through the microstructure 25, light having polarization in the longitudinal direction and light having polarization in the lateral direction generates a red region and a blue region, respectively, and a light component thereby occurs which is not absorbed by the second inorganic photoelectric converter 22.

In the microstructure 25, a width of each dot 25a is in the range of, for example, 20 to 300 nm.

A thickness of each dot 25a is in the range of, for example, 10 to 300 nm.

The distance between adjacent dots 25a is in the range of, for example, 20 to 250 nm.

It is preferable that a width of each dot 25a be in the range of 60 to 200 nm.

It is preferable that a thickness of each dot 25a be in the range of 30 to 100 nm.

It is preferable that the distance between adjacent dots 25a be in the range of 40 to 120.

Particularly, in this embodiment, a width of the dot 25a represents a diameter in the case where the planar configuration of the dot 25a is a circle, and a width of the dot 25a represents a length of one side in the case where the planar configuration of the dot 25a is an equilateral polygon.

Furthermore, where a refractive index of the silicon oxide layer 24c is represented by n, a thickness of the silicon oxide layer 24c is represented by d [nm], it is preferable that a relationship represented by the following Formula (3) be satisfied.

$$100 < n \cdot d < 125 \qquad (3)$$

In the case where a wavelength range of the blue light BL is in a range of, for example, 400 to 500 nm (430 nm in the embodiment), n·d is set to ¼ of the wavelength thereof (400/4<n·d<500/4), it is possible to obtain an effect that is due to multilayer interference.

However, the effect that is due to the multilayer interference is not necessarily required. The above conditions may be satisfied if the effect is required.

Moreover, in the embodiment, the silicon nitride layer 26 having a thickness of 5 nm is formed, and aluminum nano-dots which serve as the dots 25a constituting the microstructure 25 are formed on the silicon nitride layer 26 and arranged in an array configuration.

A planar configuration of each dot 25a is a regular tetragon having sides of 170 nm, and a thickness of the dot 25a is 70 nm.

Moreover, the distance between adjacent dots 25a is 45 nm.

The foregoing microstructure 25 is formed by an electron beam lithography.

Particularly, in the case of forming silicon nano-dots as the dots 25a constituting the microstructure 25 so as to be arranged in an array configuration, an optimal configuration of each dot 25a in a plan view may be, for example, a regular tetragon having sides of 105 nm in which a thickness of the dot 25a is 100 nm and the distance between adjacent dots 25a is 105 nm.

The organic photoelectric converter 23 has a constitution in which an organic photoelectric conversion layer 27 is held between a lower electrode 28 and an upper electrode 29.

The organic photoelectric conversion layer 23 selectively absorbs the green light GL, allows the other colored lights BL and RL to pass therethrough, and is formed of, for example, quinacridone.

The lower electrode 28 and the upper electrode 29 serve as a transparent electrode, and is formed of, for example, ITO (Indium Tin Oxide) or the like.

An insulating layer 30 is provided under the lower electrode 28.

In order to reduce a degree of interface reflection of the light emission side of the organic photoelectric converter 23, it is preferable to use a material that is transparent and has a refractive index close to that of ITO and thereby form the insulating layer 30 using the material.

Specifically, a hafnium oxide layer, a silicon nitride layer, a silicon oxynitride layer, or the like may be adopted.

Particularly, in the embodiment, a silicon nitride layer is formed as the insulating layer 30.

A readout circuit 31 and a multilayer wiring layer 32 are provided on the circuit-formed surface 2b of the semiconductor substrate 2.

Furthermore, the first inorganic photoelectric converter 21, the second inorganic photoelectric converter 22, and the organic photoelectric converter 23 are independently and electrically connected to the readout circuit 31 through a contact plug 33 that penetrates through the semiconductor substrate 2.

The contact plug 33 is formed by filling a via hole penetrating through the semiconductor substrate 2 with an electroconductive material such as tungsten.

Additionally, the contact plug 33 may be formed using a semiconductor layer or the like generated by ion implantation.

A method of manufacturing the solid-state imaging device 1A will be described.

Firstly, a red PD (the second inorganic photoelectric converter 22) having a p-n junction and two contact plugs 33 penetrating through the semiconductor substrate 2 are formed on a region that serves as each pixel 3 of the semiconductor substrate 2.

Next, after the readout circuit 31 such as a pixel transistor is formed on a top surface side that serves as the circuit-formed surface 2b of the semiconductor substrate 2, the multilayer wiring layer 32 is formed on the readout circuit 31.

Subsequently, the microstructure 25 is formed on a back surface side that serves as the light-receiving face 2a of the semiconductor substrate 2.

Next, after a colorless transparent insulating layer 24 is stacked on the microstructure 25, a blue PD (the first inorganic photoelectric converter 21) including the thinned blue-light absorbing layer 21a is formed on the insulating layer 24.

Subsequently, two contact plugs 33 are formed so as to penetrate through the insulating layer 24 and the blue-light absorbing layer 21a.

The two contact plugs 33 are connected to the two contact plugs 33 that penetrate through the aforementioned semiconductor substrate 2.

Next, the lower electrode 28 connected to one contact plug 33 is formed.

Subsequently, after the organic photoelectric conversion layer 27 is formed on the lower electrode 28, the upper electrode 29 is formed on the organic photoelectric conversion layer 27.

Accordingly, the organic photoelectric converter 23 is formed at the position which is superimposed on the first inorganic photoelectric converter 21 and the second inorganic photoelectric converter 22 when seen in a plan view.

Through the above-described steps, it is possible to manufacture the solid-state imaging device 1A.

In the solid-state imaging device 1A having the above-described constitution, of the light WL that is incident thereto through the light-receiving face 2a, the green light GL is absorbed by the organic photoelectric converter 23 and is photoelectrically converted into electrical power in one pixel 3.

Moreover, of magenta light (the blue light BL and the red light RL) that passed through the organic photoelectric converter 23, part of the blue light BL and the red light RL is absorbed by the first inorganic photoelectric converter 21 and is photoelectrically converted into electrical power.

Here, a thickness of the blue-light absorbing layer 21a is thinned such that the light sensitivity of the blue light BL becomes, for example, 50% in the first inorganic photoelectric converter 21.

Therefore, 50% of the blue light BL is absorbed by the first inorganic photoelectric converter 21 and is photoelectrically converted into electrical power.

Moreover, the remaining 50% of the blue light BL is not absorbed by the first inorganic photoelectric converter 21 and passes therethrough.

On the other hand, part of the red light RL is absorbed by the first inorganic photoelectric converter 21 and a red color mixture occurs. However, the percentage at which the red color mixture occurs is reduced by approximately 50% as compared with the case where the light sensitivity of the blue light BL is 100%.

Furthermore, the remaining part of the red light RL passes through the first inorganic photoelectric converter 21.

The blue light BL that passed through the first inorganic photoelectric converter 21 is reflected by the microstructure 25 and re-enters the first inorganic photoelectric converter 21 from the circuit-formed surface side 2b.

Because of this, the remaining 50% of the blue light BL is absorbed by the first inorganic photoelectric converter 21 and is photoelectrically converted into electrical power.

Consequently, a total amount of photocharge of the blue light BL that is to be photoelectrically converted by the inorganic photoelectric converter 21 is represented by the sum of an amount of photocharge which is generated by the blue light BL that is incident thereto through the light-receiving face 2a and an amount of photocharge which is generated by the blue light BL that re-enters the inorganic photoelectric converter 21 from the circuit-formed surface side 2b.

As a result, even in the case where a thickness of the blue-light absorbing layer 21a is thinned such that the light sensitivity of the blue light BL becomes 50% in the inorganic photoelectric converter 21, it is possible to sufficiently ensure light sensitivity with respect to the blue light BL.

On the other hand, the red light RL that passed through the first inorganic photoelectric converter 21 passes through the microstructure 25 and is incident to the second inorganic photoelectric converter 22.

Consequently, the red light RL is absorbed by the second inorganic photoelectric converter 22 and is photoelectrically converted into electrical power.

In the second inorganic photoelectric converter 22, it is possible to reduce the proportion, at which a blue color mixture occurs as a result of absorbing the blue light BL by the microstructure 25, to sufficiently cause it to be a small value.

As described above, in the solid-state imaging device 1A according to the embodiment, it is possible to further improve the light sensitivity of each of the photoelectric converters 21 and 22 while preventing occurrence of color mixture between the first inorganic photoelectric converter 21 and the second inorganic photoelectric converter 22 which are stacked in layers in the pixel 3.

Here, a proportion at which each of a red color mixture and a blue color mixture occurs in the solid-state imaging device 1A according to the embodiment was calculated using RCWA (Rigorous Coupled Wave Analysis).

Figure 3:
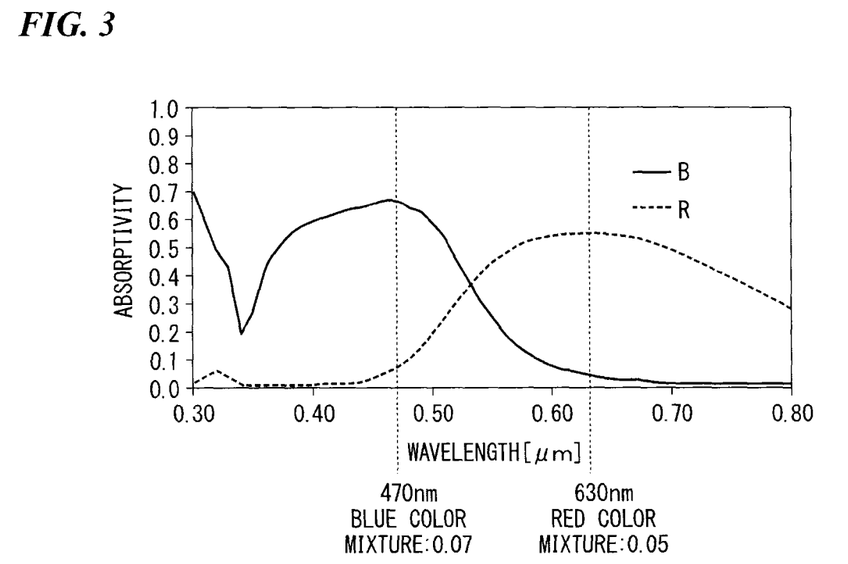
FIG. 3 is a chart that is obtained by calculating generation ratios of a red color mixture and a blue color mixture in the solid-state imaging device according to the embodiment shown in FIG. 2.

The calculation result is shown in a chart of FIG. 3.

Figure 4:
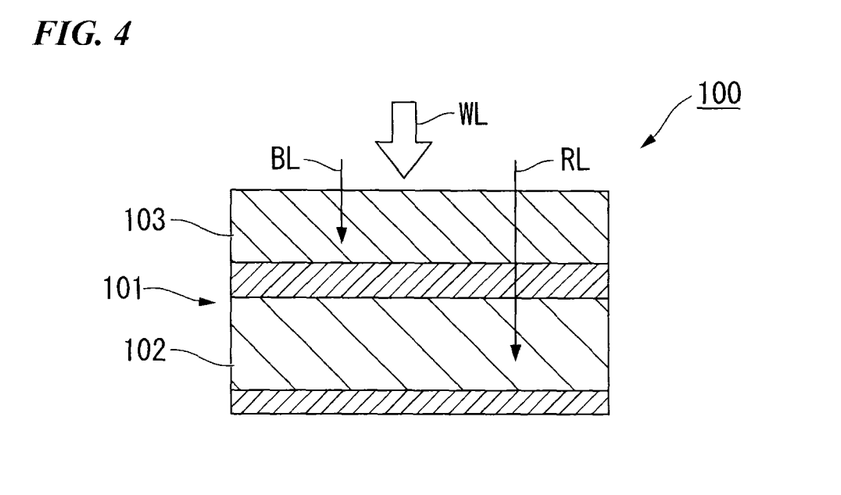
FIG. 4 is a cross-sectional view showing a cross-section structure of a conventional solid-state imaging device.

On the other hand, for comparison, a proportion at which each of a red color mixture and a blue color mixture occurs in a conventional solid-state imaging device 100 as shown in FIG. 4 was calculated using RCWA.

Figure 5:
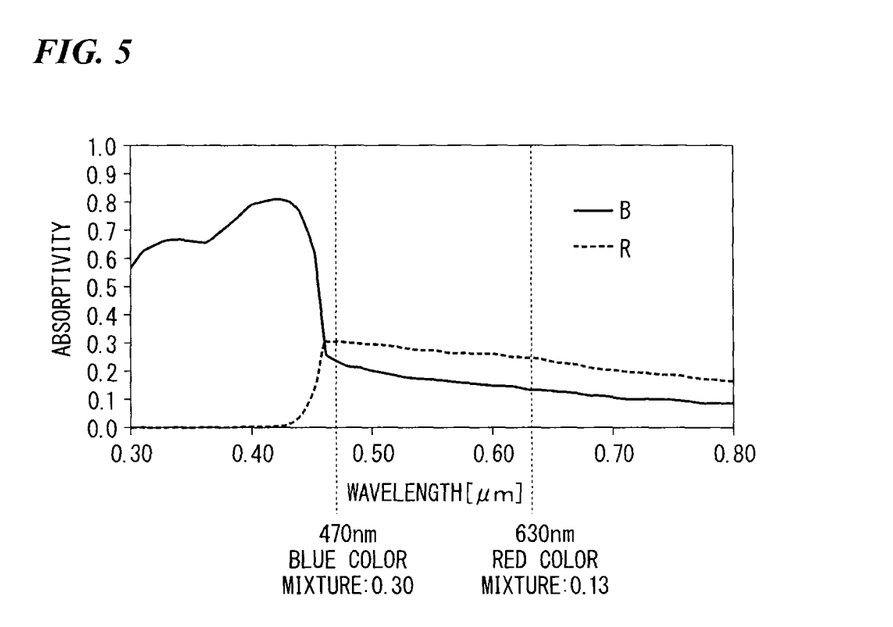
FIG. 5 is a chart that is obtained by calculating generation ratios of a red color mixture and a blue color mixture in a conventional solid-state imaging device shown in FIG. 4.

The calculation result is shown in FIG. 5.

The conventional solid-state imaging device 100 shown in FIG. 4 has a constitution such that the microstructure 25 is removed from the solid-state imaging device 1 shown in the aforementioned FIG. 1. The conventional solid-state imaging device 100 has a structure in which a blue PD 102 and a red PD 103 are stacked in order from the light-receiving face side in the depth direction thereof in a semiconductor substrate 101 made of crystal silicon.

From the results shown in FIGS. 3 and 5, in the solid-state imaging device 1A according to the embodiment, the proportions at which a red color mixture and a blue color mixture occur were 0.05 and 0.07, respectively.

On the other hand, in the conventional solid-state imaging device 100, the proportions at which a red color mixture and a blue color mixture occur were 0.13 and 0.30, respectively.

Therefore, in the solid-state imaging device 1A according to the embodiment, the percentage at which the red color mixture occurs can be reduced by 62% and the percentage at which the blue color mixture occurs can be reduced by 77% with respect to the conventional solid-state imaging device 100.

Additionally, it could be seen that peak values of an absorptivity of the blue light BL and an absorptivity of the red light RL are 66% and 55%, respectively, and it is possible to sufficiently ensure a necessary light sensitivity in the solid-state imaging device 1A according to the embodiment.

Second Embodiment

Next, a solid-state imaging device 1B according to a second embodiment will be described with reference to FIG. 6.

Figure 6:
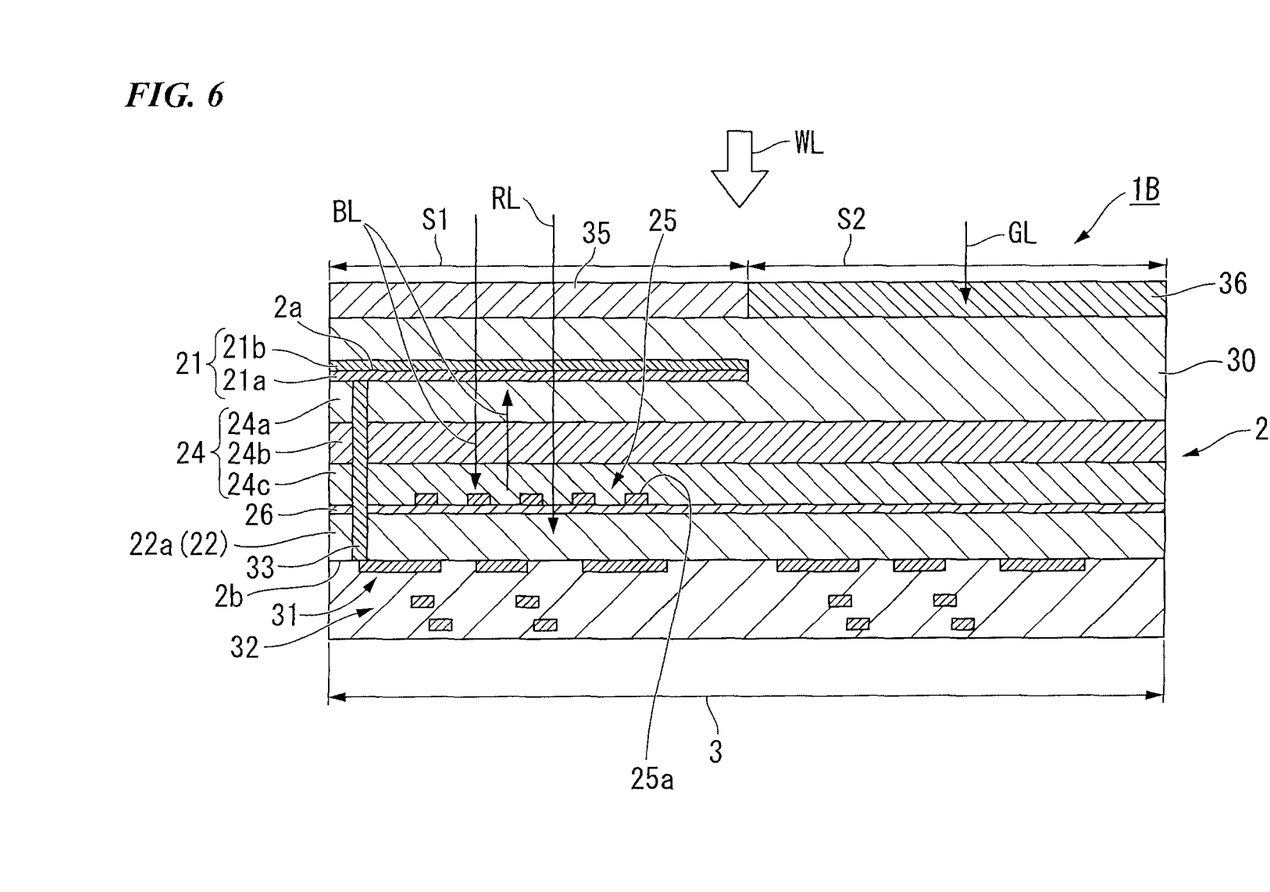
FIG. 6 is a cross-sectional view showing a cross-section structure of the solid-state imaging device according to a second embodiment.

FIG. 6 is a cross-sectional view showing a cross-section structure corresponding to one pixel 3 that is provided in the solid-state imaging device 1B according to the second embodiment.

In the solid-state imaging device 1B according to the second embodiment, identical reference numerals are used for the elements which are identical to those of the solid-state imaging device 1A according to the first embodiment shown in the aforementioned FIG. 2, and an explanation thereof is omitted here.

The solid-state imaging device 1B according to the second embodiment includes a second part that is provided adjacent to the first part and includes a second inorganic photoelectric converter, a first color filter, and a second color filter.

The first color filter is provided to face a first inorganic photoelectric converter in the first part and absorbs light having a first wavelength component and light having a second wavelength component.

The second color filter is provided to face a second inorganic photoelectric converter in the second part and absorbs light having a third wavelength component.

Specifically, in the constitution of the solid-state imaging device 1B, as shown in FIG. 6, a first region S1 (first part) on which the first inorganic photoelectric converter 21 and the second inorganic photoelectric converter 22 are provided and a second region S2 (second part) on which the second inorganic photoelectric converter 22 is provided are arranged at the positions adjacent to each other in one pixel 3 when seen in a plan view.

A magenta color filter 35 (first color filter) that allows magenta light (the blue light BL and the red light RL) to pass therethrough is arranged above the first inorganic photoelectric converter 21 in the first region S1.

A green color filter 36 (second color filter) that allows green light GL to pass therethrough is arranged above the second inorganic photoelectric converter 22 in the second region S2.

The constitution of the solid-state imaging device 1B other than the above described constitution is basically the same as that of the solid-state imaging device 1A according to the first embodiment shown in the aforementioned FIG. 2.

In the solid-state imaging device 1B having the above-described constitution, as a result of providing the microstructure 25 between the first inorganic photoelectric converter 21 and the second inorganic photoelectric converter 22, of the light WL that is incident thereto through the light-receiving face 2a, the blue light BL that is to be absorbed by the first inorganic photoelectric converter 21 is reflected by the microstructure 25 and the red light RL that is to be absorbed by the second inorganic photoelectric converter 22 passes through the microstructure 25.

Accordingly, in the solid-state imaging device 1B, similar to the above-mentioned solid-state imaging device 1A, it is possible to further improve the light sensitivity of each of the photoelectric converters 21 and 22 while preventing occurrence of color mixture between the first inorganic photoelectric converter 21 and the second inorganic photoelectric converter 22 which are stacked in layers in the pixel 3.

Third Embodiment

Next, a solid-state imaging device 1C according to a third embodiment will be described with reference to FIG. 7.

Figure 7:
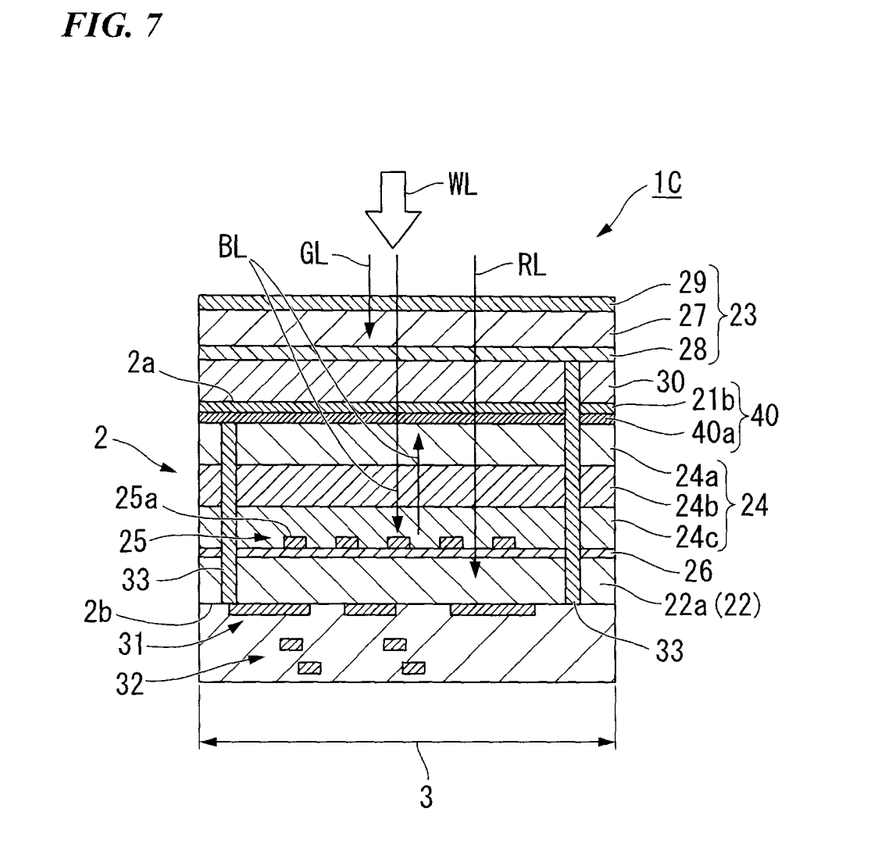
FIG. 7 is a cross-sectional view showing a cross-section structure of the solid-state imaging device according to a third embodiment.

FIG. 7 is a cross-sectional view showing a cross-section structure corresponding to one pixel 3 that is provided in the solid-state imaging device 1C according to the third embodiment.

In the solid-state imaging device 1C according to the third embodiment, identical reference numerals are used for the elements which are identical to those of the solid-state imaging device 1A according to the first embodiment shown in the aforementioned FIG. 2, and an explanation thereof is omitted here.

As shown in FIG. 7, the solid-state imaging device 1C according to the third embodiment includes an organic photoelectric converter 40 that uses an organic photoelectric conversion layer 40a that absorbs blue light BL (light having a first wavelength component) instead of the above-described blue-light absorbing layer 21a.

The constitution of the solid-state imaging device 1B other than the above described constitution is basically the same as that of the solid-state imaging device 1A according to the first embodiment shown in the aforementioned FIG. 2.

As the organic photoelectric conversion layer 40a, for example, coumarin may be used.

However, since a wavelength selectivity of coumarin is not sufficiently obtained, 20% of light is absorbed in a wavelength region other than the blue light BL in a visual light range.

For this reason, as a result of thinning a thickness of the organic photoelectric conversion layer 40a such that the light sensitivity of the blue light BL becomes 50%, an occurrence of a red color mixture is reduced.

In this case, it is preferable that a thickness of the organic photoelectric conversion layer 40a be approximately 100 nm.

In the solid-state imaging device 1C having the above-described constitution, as a result of providing the microstructure 25 between the organic photoelectric converter 40 and the second inorganic photoelectric converter 22, of the light WL that is incident thereto through the light-receiving face 2a, the blue light BL that is to be absorbed by the organic photoelectric converter 40 is reflected by the microstructure 25 and the red light RL that is to be absorbed by the second inorganic photoelectric converter 22 passes through the microstructure 25.

Accordingly, in the solid-state imaging device 1C, similar to the above-mentioned solid-state imaging device 1A, it is possible to further improve the light sensitivity of each of the photoelectric converters 40 and 22 while preventing occurrence of color mixture between the organic photoelectric converter 40 and the second inorganic photoelectric converter 22 which are stacked in layers in the pixel 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
  a first inorganic photoelectric converter configured to include a blue-light absorbing layer that absorbs blue light, wherein an absorption factor of the blue-light absorbing layer is represented by $\alpha_B$ [nm$^{-1}$] and a thickness of the blue-light absorbing layer is represented by $d_B$ [nm], a relationship represented by $0.21 < \alpha_B \cdot d_B < 2.3$ is satisfied;
  a semiconductor substrate that includes: a light-receiving face to which light is to be incident, the light having a first wavelength component is blue light, and the light having a second wavelength component is red light; and a circuit-formed surface on which a circuit comprising a readout circuit is formed, the light-receiving face facing the first inorganic photoelectric converter, the semiconductor substrate including a second inorganic photoelectric converter thereinside, the second inorganic photoelectric converter being configured to include a red-light absorbing layer that absorbs the red light, wherein an absorption factor of the red-light absorbing layer is represented by $\alpha_R$ [nm$^{-1}$] and a thickness of the red-light absorbing layer is represented by $d_R$ [nm], a relationship represented by $1.4 < \alpha_R \cdot d_R < 2.6$ is satisfied;
  a first part comprising a microstructure arranged between the first inorganic photoelectric converter and the second inorganic photoelectric converter, the microstructure being configured to include a plurality of dots which are arranged in an array configuration, each dot having a symmetric shape on a plane surface in a plan view, each dot having a width in a range of 20 to 300 nm and having a thickness in a range of 10 to 300 nm in the microstructure, the dots adjacent to each other being distanced at a distance in a range of 20 to 250 nm; and
  a silicon oxide layer provided between the blue-light absorbing layer and the microstructure, wherein a refractive index of the silicon oxide layer is represented by n and a thickness of the silicon oxide layer is represented by d [nm], a relationship represented by $100 < n \cdot d < 125$ is satisfied.

2. The solid-state imaging device according to claim 1, wherein
  of the light that is incident to the light-receiving face side, light that has a first wavelength component and is to be absorbed by the first inorganic photoelectric converter is reflected by the microstructure, light that has a second wavelength component and is to be absorbed by the second inorganic photoelectric converter passes through the microstructure.

3. The solid-state imaging device according to claim 1, wherein
  the blue-light absorbing layer contains amorphous silicon.

4. The solid-state imaging device according to claim 1, further comprising:
  an organic photoelectric converter formed on a surface of the semiconductor substrate which is close to the light-receiving face, the organic photoelectric converter comprising an organic photoelectric conversion layer that absorbs light having a third wavelength component.

5. The solid-state imaging device according to claim 4, wherein
  the light having the third wavelength component is green light,
  the organic photoelectric converter is provided on a position that overlaps a position on which the first inorganic photoelectric converter and the second inorganic photoelectric converter are formed.

6. The solid-state imaging device according to claim 1, further comprising:
  a second part that is provided adjacent to the first part and includes the second inorganic photoelectric converter;
  a first color filter that is provided to face the first inorganic photoelectric converter of the first part and absorbs light having a first wavelength component and light having a second wavelength component; and
  a second color filter that is provided to face the second inorganic photoelectric converter of the second part and absorbs light having a third wavelength component.

7. The solid-state imaging device according to claim 1, wherein
  each of the first inorganic photoelectric converter and the second inorganic photoelectric converter is independently connected to the readout circuit.

* * * * *